US011979127B2

(12) United States Patent
Suntken et al.

(10) Patent No.: US 11,979,127 B2
(45) Date of Patent: May 7, 2024

(54) ELECTRONIC CIRCUIT THAT GENERATES A HIGH-IMPEDANCE LOAD AND AN ASSOCIATED METHOD

(71) Applicant: INSIAVA (PTY) LTD., Pretoria (ZA)

(72) Inventors: Artur Wilhelm Suntken, Pretoria (ZA); Nicolaas Mattheus Fauré, Pretoria (ZA)

(73) Assignee: INSIAVA (PTY) LTD. (ZA)

(*) Notice: Subject to any disclaimer, the term of this patent is extended or adjusted under 35 U.S.C. 154(b) by 159 days.

(21) Appl. No.: 17/783,181

(22) PCT Filed: Nov. 12, 2020

(86) PCT No.: PCT/IB2020/060645
§ 371 (c)(1),
(2) Date: Jun. 7, 2022

(87) PCT Pub. No.: WO2021/116795
PCT Pub. Date: Jun. 17, 2021

(65) Prior Publication Data
US 2023/0011971 A1 Jan. 12, 2023

(30) Foreign Application Priority Data

Dec. 10, 2019 (NL) .................................... 2024412

(51) Int. Cl.
*H03H 11/02* (2006.01)
*H02J 7/34* (2006.01)
(52) U.S. Cl.
CPC .............. *H03H 11/02* (2013.01); *H02J 7/345* (2013.01); *H02J 2207/50* (2020.01)
(58) Field of Classification Search
None
See application file for complete search history.

(56) References Cited

U.S. PATENT DOCUMENTS 4,433,914 A * 2/1984 Curran ...................... G01J 1/46
356/226
4,495,458 A * 1/1985 Murphy ................... H03H 7/38
324/602

(Continued)

FOREIGN PATENT DOCUMENTS

CN 107171647 9/2017

OTHER PUBLICATIONS

D. M. Caetano, D. Oliveira, J. Silva, T. Rabuske and J. Fernandes, "Tunable kΩ to GΩ pseudo-resistor with bootstrapping technique," 2017 IEEE 60th International Midwest Symposium on Circuits and Systems (MWSCAS), Boston, MA, USA, 2017, pp. 1569-1572, doi: 10.1109/MWSCAS.2017.8053236. (Year: 2017).*

(Continued)

*Primary Examiner* — Daniel C Puentes
*Assistant Examiner* — Khareem E Almo
(74) *Attorney, Agent, or Firm* — Bryan Cave Leighton Paisner LLP

(57) ABSTRACT

An electronic circuit configured to present a high-impedance load between a load point and a reference point includes a capacitive element (C) provided between a first node (Node A) and the reference point, a first element ($D_1$) connected in parallel with the capacitive element (C), a first switching element ($S_1$) provided in series between the first node (A) and a voltage source point, a second switching element ($S_2$) provided between the first node (A) and a second node (Node B), a second element ($D_2$) connected between the second switching element ($S_2$), the load point, and the reference point, and timing control logic configured to implement three stages. In a charging stage, the first switching element ($S_1$) is closed and the second switching element ($S_2$) to charge a nodal voltage $v_D(t)$ at the first node (A). In discharge stage, the first switching element ($S_1$) is open and (Continued)

the second switching element ($S_2$) is open to enable discharging of the capacitive element (C) through the first element ($D_1$). In a transfer stage, the second switching element ($S_2$) is closed to connect the first node (A) and the second node (B), after which the second switching element ($S_2$) is opened and the second element ($D_2$) is biased to present the high-impedance load.

14 Claims, 3 Drawing Sheets

(56) References Cited

U.S. PATENT DOCUMENTS

| | | | | |
|---|---|---|---|---|
| 4,887,199 | A | * | 12/1989 | Whittle .................. H02M 1/36 363/49 |
| RE34,462 | E | * | 11/1993 | Whittle ............. H02M 3/33523 363/49 |
| 5,663,675 | A | * | 9/1997 | O'Shaughnessy ....... H03K 3/03 327/554 |
| 2006/0269186 | A1 | * | 11/2006 | Frame ...................... H03H 7/24 385/12 |
| 2013/0083564 | A1 | * | 4/2013 | Bai .................. H02M 3/33592 363/21.02 |
| 2013/0114304 | A1 | * | 5/2013 | Waseem ............ H02M 3/33538 363/16 |

OTHER PUBLICATIONS

Patent Cooperation Treaty, International Search Report and Written Opinion for PCT/IB2020/060645 dated Dec. 2, 2020.

Hellen, E. H., Verifying the diode-capacitor circuit voltage decay, American Journal of Physics, 71(8): 797-800 dated Aug. 1, 2003.

* cited by examiner

ELECTRONIC CIRCUIT THAT GENERATES A HIGH-IMPEDANCE LOAD AND AN ASSOCIATED METHOD

FIELD OF INVENTION

This invention relates to an electronic circuit that generates a high-impedance load, e.g., for interfacing with sensor circuits, and it relates to a method of operating such an electronic circuit, specifically an integrated semiconductor circuit, to establish a high-impedance load.

BACKGROUND OF INVENTION

It may be required to create very high resistive on-chip impedances as part of a semiconductor integrated circuit, while attempting to minimise silicon surface area (for example in order to remain cost effective). Such highly resistive elements find use in analogue filtering, bias and grounding circuits and as terminating elements in high-impedance input stages.

An example of this is in sensor applications, where a sensor element that converts a physical parameter to an electrical signal often has a very high output impedance. In order to preserve what is usually a small signal as best as possible, the input stage of a circuit connected to such a sensor would have to present a very high, yet finite, input impedance to prevent charge build-up while not presenting unwanted loading effects to the sensor. These charge build-up and loading effects can be detrimental to correct sensor operation. A practical example is pyro-ceramic elements used in passive infrared (PIR) sensors. The same holds for thermopiles, biological sensors, gas detectors and various other sensors in general.

Important requirements of a high-impedance terminating element that forms part of an input stage for sensors may include:
- a predictable, well-established operating point—its current and voltage—and a means to establish and control this operating point;
- predictable temperature stability within a generally applicable temperature range;
- repeatability (chip-to-chip and wafer-to-wafer);
- relative insensitivity to process variations;
- not affecting the sensor and the sensing circuit's analogue inputs in a negative way;
- the device and its operation should be sufficiently robust to be implementable in standard manufacturing processes; and
- it should use a reasonable silicon area for implementation to remain cost effective.

For electronic circuits, and integrated circuits specifically, there are several solutions that one could consider. On-chip options include:
  using low-doped sheet resistors, such as high resistive polysilicon resistors, but these present the following challenges:
    they are extremely process parameter and temperature dependent;
    the large areas result in large parasitic capacitances that degrade the already small signals that elements such as sensors typically generate; and
    the large areas required for implementation has a high cost implication;
  using time-continuous current mirrors that depend on bias resistors for reference currents, but these are unsuitable for pico-Ampere currents required to present very high impedances; or
  using switched capacitor circuits to limit current draw from the sensor while preventing charge build-up.

A more suitable solution may be to use subthreshold characteristics of MOSFET (Metal-Oxide-Semiconductor Field-Effect Transistor) devices, or to utilise the exponential current-voltage relationship of a diode or BJT (Bipolar Junction Transistor), to enable the implementation of circuit elements that behave as extremely high-impedance devices, without sacrificing silicon real estate typically required for implementing large resistances using passive elements. However, it is complex and therefore not common to accurately and repeatably bias such elements.

The Applicant desires a high-impedance electronic circuit which addresses or ameliorates at least some of these issues.

In a prior art work by Hellen [1], it is shown that a circuit comprising a capacitor and a diode as shown in FIG. 1 has a time-dependent voltage behaviour shown in Equation (1), $$v_D(t) = -mV_T \ln\left(\frac{I_0}{mV_T C}\frac{t}{C}\right) \quad (1)$$

that, within defined regions of t and $v_D(t)$, is independent of the initial condition voltage of C and is an exponential function largely determined by the capacitance C, while m is a correction factor associated with the diode characteristics of a pn-junction, $I_0$ the diode reverse saturation current and $V_T = kT/q$ is the thermal voltage. This is illustrated in FIG. 1 showing capacitive discharge through the diode.

SUMMARY OF INVENTION

Accordingly, the invention provides an electronic circuit configured to present a high-impedance load between a load point and a reference point (further referred to as the high-impedance electronic circuit), the high-impedance electronic circuit including:
  a capacitive element (C) provided between a first node (Node A) and the reference point;
  a first element having a non-linear voltage-to-current relationship ($D_1$) connected in parallel with the capacitive element (C) between the first node (A) and the reference point;
  a first switching element ($S_1$) provided in series between the first node (A) and a voltage source point;
  a second switching element ($S_2$) provided between the first node (A) and a second node (Node B); and
  a second element having a non-linear voltage-to-current relationship ($D_2$) connected between the second switching element ($S_2$), the load point, and the reference point; and
  timing control logic configured to control the first switching element ($S_1$) and the second switching element ($S_2$) to bias the second element ($D_2$) and that operates in at least three stages comprising:
    a charging stage wherein the first switching element ($S_1$) is closed and the second switching element ($S_2$) is open for a charging duration ($T_{CH}$) to enable the capacitive element (C) to charge a nodal voltage $v_D(t)$ at the first node (A) to a sufficient or predefined initial voltage threshold $V_i$;

a discharge stage wherein the first switching element ($S_1$) is open and the second switching element ($S_2$) is open for a discharge duration ($T_{DCH}$) to enable discharging of the capacitive element (C) through the first element ($D_1$) such that a current through the first element ($D_1$) reaches a sufficient or pre-defined bias current ($I_{BIAS}$) and/or the nodal voltage $V_D(t=T_{CH}+T_{DCH})$ equals a sufficient or pre-defined bias voltage ($V_{BIAS}$); and a transfer stage in which the second switching element ($S_2$) is closed for a transfer duration ($T_{XFR}$) to connect the first node (A) and the second node (B), thereby to apply or transfer the bias voltage ($V_{BIAS}$) to a contact of the second element ($D_2$) connected to the second node (B) to bias the second element ($D_2$) according to the bias voltage ($V_{BIAS}$);

wherein the timing control logic is configured to open the second switching element ($S_2$) after the transfer stage, the second element ($D_2$) being biased to present the high-impedance load between the load point and the reference point.

The stages may be repeated, re-ordered, or extended, as desired.

Strictly speaking, "transfer of voltage" may comprise transfer of charge to establish a particular voltage, but for simplicity of explanation, this is referred to as "transfer of voltage".

The capacitive element (C) may be a capacitor. The capacitor may be a transistor-implemented capacitor. The capacitive element (C) may be parasitic capacitive present in another component of the electronic circuit. The capacitive element may be a non-transistor charge-carrying element.

The first and second elements ($D_1$, $D_2$) may be diodes or transistors. If the first element ($D_1$) is a transistor, then it may be a diode-connected transistor. If the first and second elements ($D_1$, $D_2$) are transistors, then they may be MOSFETs or BJTs.

The first and second elements ($D_1$, $D_2$) may have identical voltage-current relationships or may have related (e.g., proportional or scaled) voltage-current relationships.

According to Wikipedia (https://en.wikipedia.org/wiki/High_impedance, accessed 15 Nov. 2019), "Numerical definitions of "high impedance" vary by application." It may therefore be difficult to define an exact numerical range. An important application of the present invention may be in the processing of signals generated by sensors (referred to as sensor signals). In such case, one definition of "high impedance" may be in terms of effect: so as not to degrade the sensor signal to an unusable signal.

Another way of defining "high-impedance" may be to look at conventional impedance elements that the electronic circuit, in accordance with the invention, may replace. Such conventional impedance elements may be on-chip resistors, e.g., polysilicon resistors, which presently are often in the region of 10-100 kΩ and exceptionally as high as 100-1000 kΩ. Accordingly, for the purposes of this specification, high impedance may be at least 1 MΩ, may be at least 10 MΩ, may be at least 100 MΩ, and may be at least 1 GΩ.

The high-impedance load may present a resistive load only or may present a combination of a resistive and reactive load.

The transfer stage duration $T_{XFR}$ may be calculated to be sufficiently long for effective voltage transfer between the first node (A) and the second node (B), but not too long to unreasonably influence discharge of the capacitive element (C) or the bias point of the second element ($D_2$) that will usually be a transistor. The transfer duration $T_{XFR}$ may be calculated to transfer the voltage $V_D(t)$ between the first node (A) and the second node (B) using the second switching element ($S_2$) and to keep the capacitive element (C) charged to ensure that the bias point voltage on the second node (B) of the second element ($D_2$) remains above ground potential (0 V).

Switching elements may be referred to a merely as switches, for brevity. During the transfer stage, the first switch ($S_1$) may remain open.

The timing control logic may be configured to implement an idle stage for a duration of $T_{IDLE}$, depending on the exact implementation of timing signals, before commencing the next charging stage. The idling stage may be optional and $T_{IDLE}$ may be zero.

The timing control logic may be configured to repeat the charging stage, discharging stage, and transfer stage periodically or intermittently. The timing control logic may be configured to repeat the charging stage, discharging stage and transfer stage at a frequency depending on the load voltage $v_L$. The timing control logic may be configured to keep a ratio $v_L/i_L$ constant in order to establish a constant real impedance.

The voltage source point may be a power supply point or rail.

There may be a resistive element in series with the first switching element ($S_1$). The resistive element may limit an inrush of current to the capacitive element (C).

The electronic circuit may be, or may be implemented by, or may form part of, an integrated circuit.

The invention extends to a method of generating a high-impedance load between a load point and a reference point (further referred to as the high-impedance electronic circuit), the method comprising:

providing an a high-impedance electronic circuit including:
  a capacitive element (C) provided between a first node (Node A) and the reference point;
  a first element having a non-linear voltage-to-current relationship ($D_1$) connected in parallel with the capacitive element (C) between the first node (A) and the reference point;
  a first switching element ($S_1$) provided in series between the first node (A) and a voltage source point;
  a second switching element ($S_2$) provided between the first node (A) and a second node (Node B); and
  a second element having a non-linear voltage-to-current relationship ($D_2$) connected between the second switching element ($S_2$), the load point, and the reference point; and
  timing control logic configured to actuate the first switching element ($S_1$) and the second switching element ($S_2$) to bias the second element ($D_2$) and that operates in at least three stages, the method further comprising:
charging the capacitive element (C), during a charging stage wherein the first switching element ($S_1$) is closed and the second switching element ($S_2$) is open for a charging duration ($T_{CH}$), to a nodal voltage $v_D(t)$ at the first node (A) to a sufficient or pre-defined initial voltage threshold $V_i$;
discharging the capacitive element (C), during a discharge stage wherein the first switching element ($S_1$) is open and the second switching element ($S_2$) is open for a discharge duration ($T_{DCH}$), through the first element ($D_1$) such that a current through the first element ($D_1$) reaches a sufficient or pre-defined bias current ($I_{BIAS}$) and/or the nodal voltage $V_D(t=T_{CH}+T_{DCH})$ equals a sufficient or pre-defined bias voltage ($V_{BIAS}$);

transferring the bias voltage ($V_{BIAS}$), during a transfer stage in which the second switching element ($S_2$) is closed for a transfer duration ($T_{XFR}$) to connect the first node (A) and the second node (B), to a contact of the second element ($D_2$) connected to the second node (B) to bias the second element ($D_2$) according to the bias voltage ($V_{BIAS}$); and opening the second switching element ($S_2$) after the transfer stage, the second element ($D_2$) being biased to present the high-impedance load between the load point and the reference point.

The method defined above may be implemented by the electronic circuit defined above.

BRIEF DESCRIPTION OF DRAWINGS

The invention will now be further described, by way of example, with reference to the accompanying diagrammatic drawings.

In the drawings.

DETAILED DESCRIPTION OF EXAMPLE EMBODIMENT

The present invention will be described first with reference to some enabling theory and then with reference to a practical implementation of that theory.

This invention proposes that the above-mentioned characteristics of non-linear elements (e.g., MOS transistors, diodes and BJTs) can be used to create high-impedance terminating elements. An aspect of this invention pertains to the method with which such a high-impedance element can be biased in an appropriate region of operation to yield the intended results.

Figure 1:
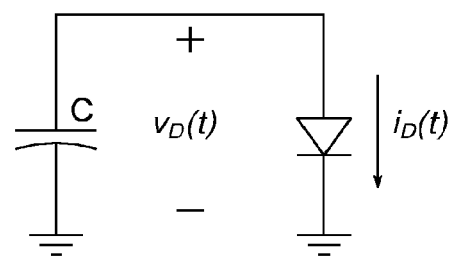
FIG. 1 shows a schematic circuit diagram of a PRIOR ART circuit, showing capacitive discharge through a diode, of Reference [1]

The present invention builds on the phenomenon explained in Equation (1) and FIG. 1 by noting that, if the calculation is rewritten in terms of the diode current $i_D(t)$, it can be shown that $$i_D(t) \approx mV_T \frac{C}{t} \quad (2)$$

for currents much larger than $I_0$. This is significant since the result shows that for a capacitor discharging through a forward-biased diode, the diode current only depends on the total nodal capacitance C and time t.

Figure 2:
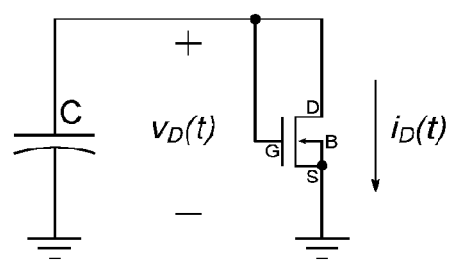
FIG. 2 shows a schematic circuit diagram with the diode in FIG. 1 replaced with a transistor.

This result can be extended to MOS transistors by analysing the circuit in FIG. 2, where the diode of FIG. 1 is replaced by a diode-connected NMOS (n-type MOS) transistor.

It can be shown that, where the term t/C and the nodal voltage $v_D(t)$ (from Equation (1)) are appropriately constrained, the current through the MOS transistor follows the expression $$i_D(t) \approx nV_T e^{\left(\frac{-V_t}{nV_T}\right)} \frac{C}{t} \quad (3)$$

where n is a technology constant, $V_T$ is the thermal voltage, $V_t$ is the MOS transistor's threshold voltage and C represents the nodal capacitance.

To generalize both cases, Equations (2) and (3) can be rewritten and interpreted as $$i_D(t) = k\frac{C}{t} \quad (4)$$

where k is a technology constant, C the capacitance being discharged and t the time. The resulting Equation (4) yields an unexpected insight that it is possible to set the discharge current, and consequently the operating point of the device or circuit, by choosing only C and an appropriate t.

The present invention discloses that the characteristics described above, resulting in Equation (4), may be used in a unique way to establish a well-controlled bias point for a device to serve as a high-impedance element.

This can be illustrated using a typical field effect transistor, such as an NMOS transistor, as would normally be available to a circuit designer implementing a design using a CMOS fabrication process. The device has four terminals comprising a gate (G), drain (D), source (S) and bulk (B). In strong inversion operation, the gate-source voltage $V_{GS}>V_t$, while with subthreshold operation it is required that $V_{GS}<V_t$. It is known that in the subthreshold region the device has a significantly higher output impedance between the drain-source terminal than in strong inversion.

Referring again to the circuit in FIG. 2, the capacitor may start with an initial voltage $V_i$ at t=0 that is well above the threshold voltage $V_t$ of the device. Since $V_{GS}=V_{DS}>V_t$, the device starts in strong inversion and within a very short time; the device discharges so that $V_{GS}$ drops below $V_t$. In a typical 0.35 µm CMOS process, given a reasonable value for C, this happens within a few hundred nanoseconds or less. Once $V_{GS}$ is lower than $V_t$, the transistor enters its subthreshold region of operation and the rate of discharge becomes significantly slower. From Equation (3), generalized as Equation (4), the magnitude of the current becomes dependent only on time t, the nodal capacitance C and a technology or device constant k.

By using Equation (4) and choosing a target MOS element bias current $I_{BIAS}$ (which may be considered as $i_D(t=T_{CH}+T_{DCH})$) while selecting C, it is possible to determine the required discharge time $T_{DCH}$ so that $i_D(t=T_{CH}+T_{DCH})=I_{BIAS}$ and conversely it is possible to determine a C value for a predefined $T_{DCH}$, given that an initial voltage was present on the node so that $v_D(t=T_{CH})=V_i$.

Since the discharging device is used to establish $I_{BIAS}$, the same device cannot be used to act as a high-impedance circuit element by itself. However, the gate-source voltage $V_{GS}$ of the transistor associated with the current $i_D(t=T_{CH}+$ $T_{DCH}$) can now be used to replicate the bias point of the transistor by "copying" the gate voltage to another, second, MOS transistor. If the second transistor is sized the same, and operating under the same conditions on its terminals, the second transistor can be employed as the intended high-impedance circuit element by considering the behaviour between its drain and source terminal. Since it is known from Gray [2] for subthreshold operation that $$I_D = \frac{W}{L} I_t e^{\left(\frac{V_{GS} - V_t}{nV_T}\right)} \left[1 - e^{\left(-\frac{V_{DS}}{V_T}\right)}\right] \quad (5)$$

which shows that, for $V_{DS} \gg V_T$, the output current remains largely constant for a given $V_{GS}$ and the small-signal output impedance is shown, excluding drain-induced barrier lowering and body effects, to be $$r_{DS} = \frac{\partial V_{DS}}{\partial I_D} = \frac{V_T}{\frac{W}{L} e^{\left(\frac{V_{GS} - V_t}{nV_T}\right)} - I_D} \quad (6)$$

for a constant $V_{GS}$ that, although non-linear, can realize very large impedances (for small signals). Alternatively, the terminating element can be used to create very small but predictable and well-controlled currents using this approach.

Similar behaviour can be expected from a bipolar junction transistor (BJT). Equation (2) can be adapted for a BJT by including the forward current gain term β where $i_C = \beta i_B$ and noting that the total current is $i_D = (\beta + 1) i_B$, while the small signal output impedance of a BJT can be approximated as $$r_{CE} = \frac{V_A}{I_C} \quad (7)$$

where $V_A$ is the Early-voltage associated with a specific device. $r_{CE}$ may become very large for very low values of $I_C$ that are expected from making use of Equation (2) with appropriate choices for C and t.

Figure 3:
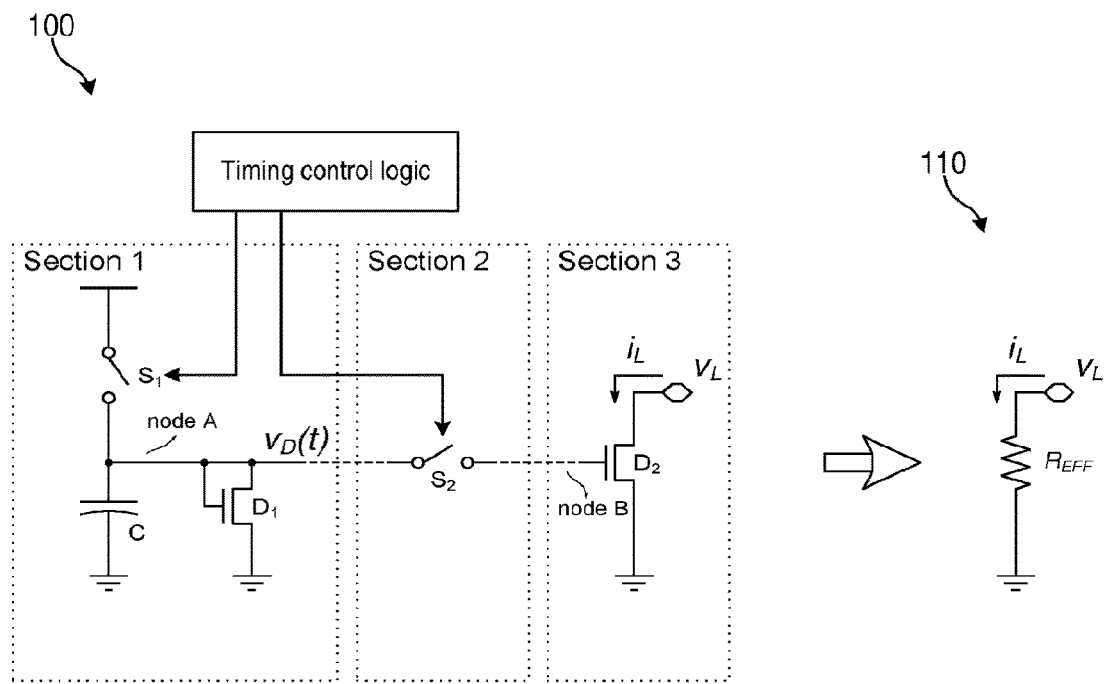
FIG. 3 shows a schematic circuit diagram of an electronic circuit configured to generate a high-impedance load, in accordance with the invention.

Turning now to a practical or technical implementation of the above theory, FIG. 3 illustrates an example electronic circuit 100 configured to generate a high-impedance load, in accordance with the invention. The electronic circuit 100 may be configured in light of conclusions made from Equation (4) to implement a high-impedance element or load. In the drawings, the reference point is illustrated as a ground point.

This example illustrates the electronic circuit 100 using an active element ($D_1$) with a non-linear voltage-to-current relationship in the form of an NMOS transistor, but other implementations are practicable (see below). The electronic circuit 100 may comprise three conceptual sections, each serving a particular purpose during various stages of operation.

1. A first section (Section 1) of the electronic circuit 100 that generates a voltage signal that can be used to bias a transistor in subthreshold or low current region depending on the required load impedance $\Delta v_L / \Delta i_L$ or load current bias point $i_L$.
2. A second section (Section 2) of the electronic circuit 100 that transfers the bias point voltage signal on node A of the first section of the circuit to node B of the third section.
3. A third section (Section 3) of the electronic circuit 100 containing the element that utilizes the transferred voltage signal to bias a transistor in a way to establish a high-impedance load as seen from the behaviour of $v_L$ (which is the voltage at the load point) and $i_L$. Section 3, after the transfer stage, presents a high-impedance load, as represented by $R_{EFF}$ in circuit 110.

Sections 1 and 2 may be considered a biasing portion of the circuit 100 while the third section is the load-presenting section.

During design, a circuit designer must choose the target current setpoint $I_{BIAS}$ for transistor $D_1$ or required small-signal impedance using Equations (4) and/or (6) and then derive values for the capacitance C and the discharge duration $T_{DCH}$.

The first section of the electronic circuit 100 comprises three main elements:
- an element which may be an active element such as a transistor or diode, $D_1$ in FIG. 3, either n-type or p-type depending on the exact circuit implementation;
- a capacitive element (C), typically a capacitor and the parasitic capacitance on node A in FIG. 3, and
- a switching element, $S_1$ in FIG. 3, that can connect and disconnect the capacitive element from a power source so that an initial voltage can be set or established on the node.

Figure 4:
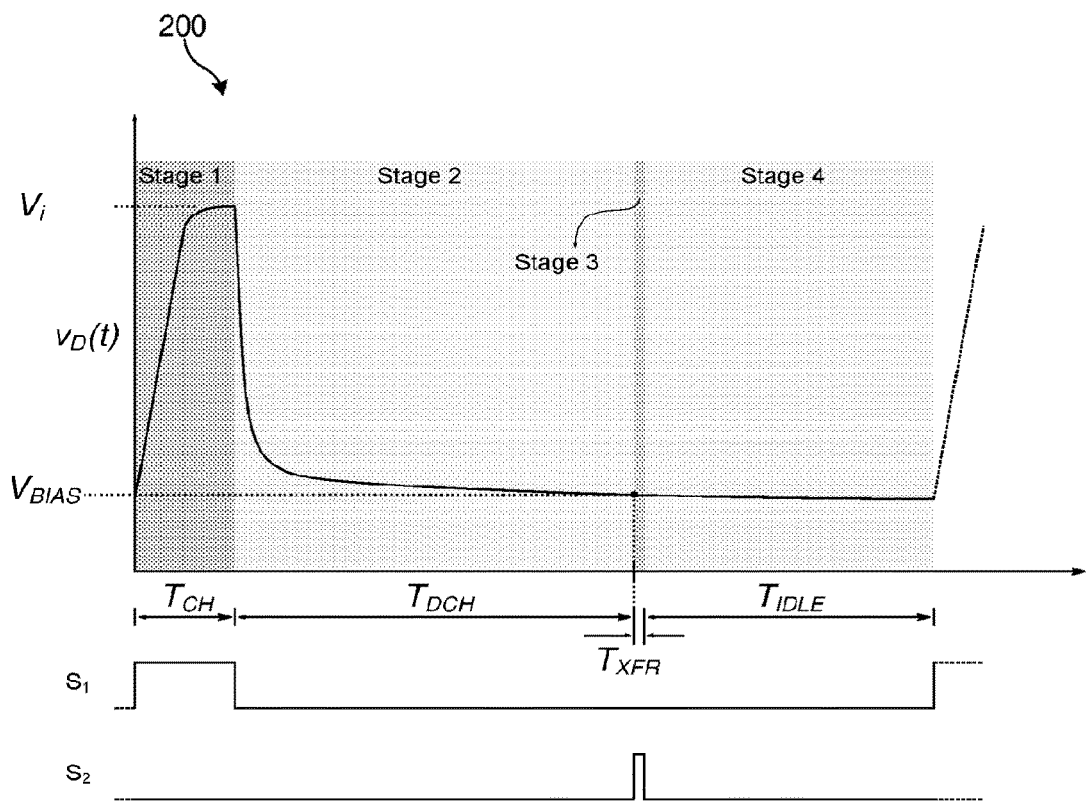
FIG. 4 shows a graph of various stages of operation of the electronic circuit of FIG. 3 and timing signals on switches.

FIG. 4 shows a graph 200 illustrating the different stages of circuit operation that enables $D_2$ in FIG. 3 to act as a high-impedance element as described above. The timing signals that close $S_1$ and $S_2$ are also indicated.

The four stages of the circuit operation in FIG. 4 can be explained as:

1. Stage 1 (charging): During this stage 1, a switch $S_1$ connects the charge storing node to a charging source, usually a power supply rail and possibly through a resistive element to limit the inrush current to the storage element, while switch $S_2$ is open. The charging stage duration $T_{CH}$ should be long enough to ensure that the nodal voltage $v_D(t)$ reaches a level sufficiently high so that Equation (2) is valid for a diode or bipolar transistor or Equation (3) for a diode-connected MOS device. Although a small current will flow through the discharge element, the NMOS transistor $D_1$ in FIG. 3, it should be negligible compared to the charging current flowing through $S_1$. Once a sufficient initial voltage $v_D(t = T_{CH}) = V_i$ is reached, the switch $S_1$ opens, where $T_{CH}$ marks the duration of the charging stage and the next stage commences.

2. Stage 2 (discharge) During this stage 2, $S_1$ and $S_2$ are both open and $v_D(t = T_{CH}) = V_i$ is the initial voltage on node A at the onset of the discharge stage. The first part of the circuit now follows the behaviour of general Equation (4) with the charge stored on node A discharging through the element, the diode-connected NMOS $D_1$ in FIG. 3. Depending on the parameters the designer chose, the duration of this stage should be $T_{DCH}$ at which the current through $D_1$ will reach the target value of $I_{BIAS}$ with a nodal voltage $v_D(t = T_{CH} + T_{DCH}) = V_{BIAS}$.

3. Stage 3 (transfer): At the end of the discharge stage, switch $S_2$ closes in order to transfer the voltage on node A, $V_{BIAS}$, to node B. Ideally, the voltage on node B is now equal to the voltage on node A and will persist after $S_2$ opens, although this may take plural repetitions to occur. For the example in FIG. 3 $V_{BIAS}$ would now be present on the gate of $D_2$ and thereby bias the device according to Equations (5) and (6) to act as the intended high-impedance circuit element, e.g., between its drain and source terminals. The duration of this stage 3 $T_{XFR}$, with $S_2$ being closed, should be sufficiently long for effective voltage transfer between nodes A and B, but not too long to unreasonably influence the discharge circuit and bias point. The transfer stage ends when switch $S_2$ opens. A total node capacitance on node B should be high enough to retain this voltage and inhibit discharge (and voltage drop/change) during the time when $S_2$ is open.

4. Stage 4 (idle stage): After the bias point was transferred to the load device $D_2$, the system may enter an optional idle stage 4 for a duration of $T_{IDLE}$, depending on the exact implementation of the timing signals, before commencing the next charging stage. For most cases, $T_{IDLE}$ will likely be zero. This stage may be optional.

5. Repeating the process to establish and maintain bias: In order to establish and maintain the bias point the three stages above need to be repeated periodically or intermittently to maintain an accurate $V_{BIAS}$, especially when using bipolar devices with non-negligible base currents influencing the setpoint on node B. In addition, when first establishing the bias point, node B may require multiple cycles of charge transfer from node A before settling on or around the intended bias voltage $V_{BIAS}$, due to the capacitance ratio of node A to node B. The initial condition of each of the repeating cycles is $v_D(t=T_{CH})=V_i$ that therefore allows $v_D(t=T_{CH}+T_{DCH})=V_{BIAS}$ to settle after multiple cycles allowing a stable high-impedance operating point to be applied to $D_2$. The timing control logic may be configured to repeat the charging stage, discharging stage, and transfer.

Figure 5:
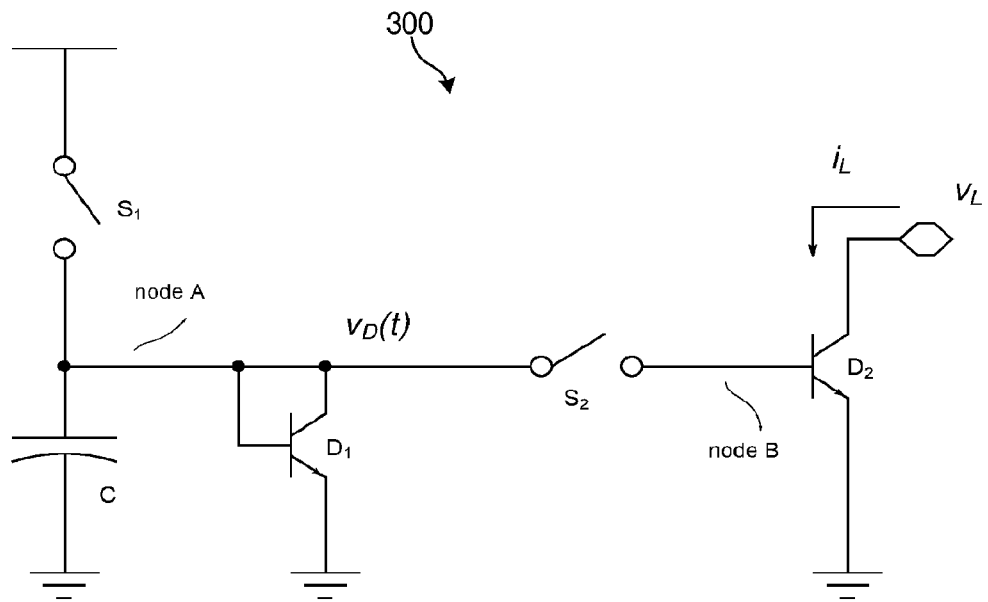
FIG. 5 shows a schematic circuit diagram of another embodiment of an electronic circuit configured to generate a high-impedance load, in accordance with the invention.
Figure 6:
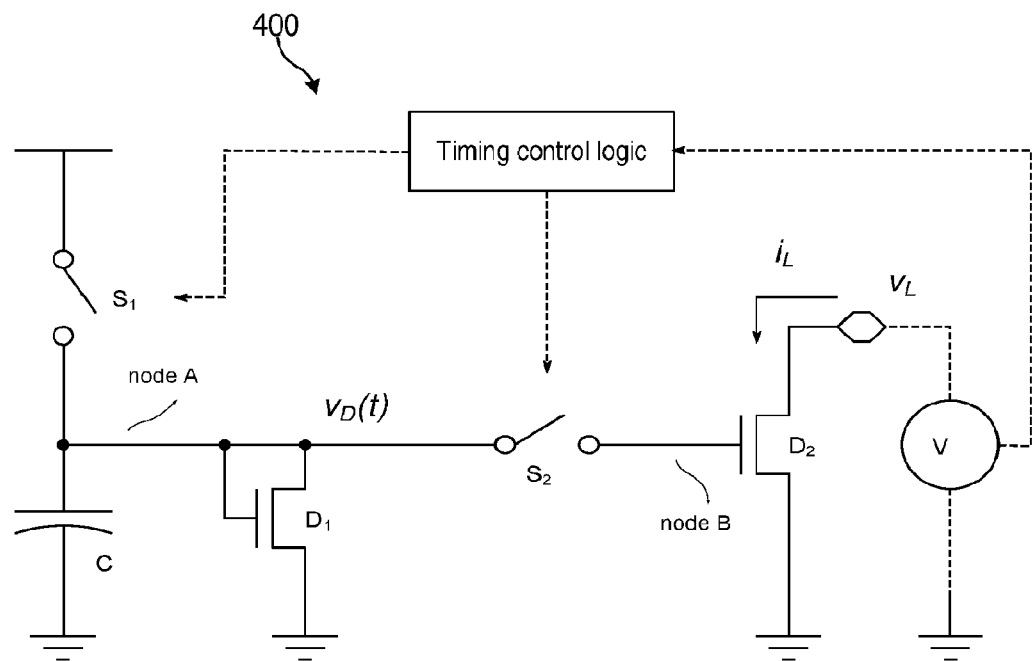
FIG. 6 shows a schematic circuit diagram of a further embodiment of an electronic circuit configured to generate a high-impedance load, in accordance with the invention.

Other variations of the electronic device 100 are possible, as illustrated in FIGS. 5-6. The first variation from the circuit shown in FIG. 3 is that the two NMOS transistors may be implemented using bipolar junction devices (BJTs) and adapting the circuit for the necessary changes in behaviour, such as the continued presence of base currents, as shown in FIG. 5 as electronic device 300, in accordance with the invention. Such adaptation may require adding capacitance in addition to any existing parasitic capacitance to node B for sustaining these currents while maintaining the nodal voltage.

The second variation from the circuit shown in FIG. 3 is that the transistors, either MOS or BJT devices or combination thereof, may be implemented by either n-type or p-type devices by adapting the circuit and associated polarities accordingly.

While the method of circuit operation described in the preceding section focuses on using the discharge time $T_{DCH}$ as the determining factor when interpreting Equation (4), it should be noted that Equation (4) can also be amended to express $I_{BIAS}$, the bias current through $D_1$ as on $t=T_{CH}+T_{DCH}$ in terms of frequency as $$I_{BIAS}(f)=kCf \quad (8)$$

where, for each period the voltage on node A starts at a repeatable initial voltage $V_i$ and $f=1/(T_{CH}+T_{DCH}+T_{XFR})$ when omitting the idle stage. The frequency f can be changed by changing the respective durations of each stage accordingly.

The circuit of FIG. 3, and similar circuits in general, may be adapted so that device $D_1$ is geometrically different from device $D_2$ so that the ultimate current through $D_2$ is a scaled version of the current through $D_1$. For example, suppose for FIG. 3 the (W/L)—ratio of $D_2$ over $D_1$ is 2, then $D_2$ would conduct approximately twice the current for given $V_{BIAS}$ than $D_1$—that is, $i_L=2I_{BIAS}$. In this way, geometrical adaptations to the devices may be made to compensate or fine-tune the current of the high impedance terminating element $D_2$ for different applications. For BJTs, the emitter area can be scaled to the same effect.

While $D_2$ presents a very high small-signal impedance for a given operating bias point, such an impedance is non-linear as the voltage $v_L$ on the drain (for field-effect transistors) or collector (for bipolar transistors) of $D_2$ changes. In another variation it is possible to dynamically compensate for this by adapting $T_{DCH}$ in absolute terms as illustrated in diagram 400 in FIG. 6. For a fixed repeating period of $T_{TOTAL}=T_{CH}+T_{DCH}+T_{XFR}+T_{IDLE}=1/f$, $T_{DCH}$ may be adapted in isolation by appropriately adjusting the switching signals of $S_1$ and $S_2$. The frequency f may also be dynamically adapted, thereby implicitly changing $T_{DCH}$ to accommodate for changes in $v_L$ and consequently $R_{EFF}$ shown in FIG. 3 in order to keep the value of $R_{EFF}$ relatively constant.

The Applicant believes that the invention as exemplified is advantageous in that the circuit 100, 300, 400 can be fabricated using cost-effective, industry standard manufacturing processes such as silicon-based CMOS (complementary metal-oxide-semiconductor). The circuit 100, 300, 400 finds application in read-out circuits of passive infrared (PIR) sensors and other sensors.

The invention as described provides a new way to create a high-impedance terminating element that fulfils the requirements for such a circuit 100, 300, 400 as part of a sensor circuit front-end. As an added advantage, the circuit 100, 300, 400 and method described enables a highly dynamic and adaptable solution that can form part of modern-day high-performance integrated circuits in a cost-effective way.

REFERENCES

[1] Hellen, E. H., "Verifying the diode-capacitor circuit voltage delay", American Journal of Physics, Vol. 71, no. 8, 10 Jul. 2003.

[2] Grey, P. R., et al, "Analysis and design of analog integrated circuits", 4$^{th}$ edition, John Wiley and Sons, Inc., 2001.

What is claimed is:

1. An electronic circuit configured to present a high-impedance load between a load point and a reference point (further referred to as the high-impedance electronic circuit), the high-impedance electronic circuit including:

a capacitive element (C) provided between a first node (Node A) and the reference point;

a first element having a non-linear voltage-to-current relationship ($D_1$) connected in parallel with the capacitive element (C) between the first node (A) and the reference point;

a first switching element ($S_1$) provided in series between the first node (A) and a voltage source point;

a second switching element ($S_2$) provided between the first node (A) and a second node (Node B); and a second element having a non-linear voltage-to-current relationship ($D_2$) connected between the second switching element ($S_2$), the load point, and the reference point; and timing control logic configured to control the first switching element ($S_1$) and the second switching element ($S_2$) to bias the second element ($D_2$) to operate in at least three stages comprising:

a charging stage wherein the first switching element ($S_1$) is closed and the second switching element ($S_2$) is open for a charging duration ($T_{CH}$) to enable the capacitive element (C) to charge a nodal voltage $v_D(t)$ at the first node (A) to a pre-defined initial voltage threshold $V_i$;

a discharge stage wherein the first switching element ($S_1$) is open and the second switching element ($S_2$) is open for a discharge duration ($T_{DCH}$) to enable discharging of the capacitive element (C) through the first element ($D_1$) such that a current through the first element ($D_1$) reaches a pre-defined bias current ($I_{BIAS}$) and/or the nodal voltage $V_D(t=T_{CH}+T_{DCH})$ equals a pre-defined bias voltage ($V_{BIAS}$); and a transfer stage in which the second switching element ($S_2$) is closed for a transfer duration ($T_{XFR}$) to connect the first node (A) and the second node (B), thereby to apply or transfer the bias voltage ($V_{BIAS}$) to a contact of the second element ($D_2$) connected to the second node (B) to bias the second element ($D_2$) according to the bias voltage ($V_{BIAS}$);

wherein the timing control logic is configured to open the second switching element ($S_2$) after the transfer stage, the second element ($D_2$) being biased to present the high-impedance load between the load point and the reference point.

2. The electronic circuit as claimed in claim 1, in which the first and second elements ($D_1$, $D_2$) are diodes or transistors.

3. The electronic circuit as claimed in claim 2, in which the first element ($D_1$) is a diode-connected transistor and the second element ($D_2$) is a transistor.

4. The electronic circuit as claimed in claim 3, in which:
the first and second elements ($D_1$, $D_2$) are MOSFETs (Metal-Oxide-Semiconductor Field-Effect Transistors);
the first and second elements ($D_1$, $D_2$) are BJTs (Bipolar Junction Transistors);
the first element ($D_1$) is a BJT and the second element ($D_2$) is a MOSFET; or
the first element ($D_1$) is a diode and the second element ($D_2$) is a BJT.

5. The electronic circuit as claimed in claim 1, in which the first and second elements ($D_1$, $D_2$) have related voltage-current relationships.

6. The electronic circuit as claimed in claim 1, in which the transfer duration $T_{XFR}$ is calculated to transfer the voltage $V_D(t)$ between the first node (A) and the second node (B) using the second switching element ($S_2$) and to keep the capacitive element (C) charged to ensure that the bias point voltage on the second node (B) of the second element ($D_2$) remains above ground potential (0 V).

7. The electronic circuit as claimed in claim 1, in which the timing control logic is configured to repeat the charging stage, discharging stage, and transfer stage periodically or intermittently.

8. The electronic circuit as claimed in claim 7, in which the timing control logic is configured to repeat the charging stage, discharging stage and transfer stage at a frequency depending on the load voltage $V_L$.

9. The electronic circuit as claimed in claim 8, in which the timing control logic is configured to keep a ratio $v_L/i_L$ constant in order to establish a constant real impedance.

10. The electronic circuit as claimed in claim 1, which is, or which forms part of, an Integrated Circuit (IC).

11. A method of generating a high-impedance load between a load point and a reference point (further referred to as the high-impedance electronic circuit), the method comprising:
providing a high-impedance electronic circuit including:
a capacitive element (C) provided between a first node (Node A) and the reference point;
a first element having a non-linear voltage-to-current relationship ($D_1$) connected in parallel with the capacitive element (C) between the first node (A) and the reference point;
a first switching element ($S_1$) provided in series between the first node (A) and a voltage source point;
a second switching element ($S_2$) provided between the first node (A) and a second node (Node B); and
a second element having a non-linear voltage-to-current relationship ($D_2$) connected between the second switching element ($S_2$), the load point, and the reference point; and
timing control logic configured to actuate the first switching element ($S_1$) and the second switching element ($S_2$) to bias the second element ($D_2$) in at least three stages, the method further comprising:
charging the capacitive element (C), during a charging stage wherein the first switching element ($S_1$) is closed and the second switching element ($S_2$) is open for a charging duration ($T_{CH}$), to a nodal voltage $v_D(t)$ at the first node (A) to a sufficient or pre-defined initial voltage threshold $V_i$;
discharging the capacitive element (C), during a discharge stage wherein the first switching element ($S_1$) is open and the second switching element ($S_2$) is open for a discharge duration ($T_{DCH}$), through the first element ($D_1$) such that a current through the first element ($D_1$) reaches a sufficient or pre-defined bias current ($I_{BIAS}$) and/or the nodal voltage $V_D(t=T_{CH}+T_{DCH})$ equals a sufficient or pre-defined bias voltage ($V_{BIAS}$);
transferring the bias voltage ($V_{BIAS}$), during a transfer stage in which the second switching element ($S_2$) is closed for a transfer duration ($T_{XFR}$) to connect the first node (A) and the second node (B), to a contact of the second element ($D_2$) connected to the second node (B) to bias the second element ($D_2$) according to the bias voltage ($V_{BIAS}$); and
opening the second switching element ($S_2$) after the transfer stage, the second element ($D_2$) being biased to present the high-impedance load between the load point and the reference point.

12. The method as claimed in claim 11, in which the charging stage, discharging stage, and transfer stage are repeated periodically or intermittently.

13. The method as claimed in claim 12, in which the charging stage, discharging stage, and transfer stage are repeated at a frequency depending on the load voltage $V_L$.

14. The method as claimed in claim 13, which includes keeping a ratio $v_L/i_L$ constant in order to establish a constant real impedance.

* * * * *